United States Patent [19]

Gold

[11] Patent Number: 5,231,545
[45] Date of Patent: Jul. 27, 1993

[54] FAULT TOLERANT RLL DATA SECTOR ADDRESS MARK DECODER

[75] Inventor: Clifford M. Gold, Fremont, Calif.

[73] Assignee: Quantum Corporation, Milpitas, Calif.

[21] Appl. No.: 710,065

[22] Filed: Jun. 4, 1991

[51] Int. Cl.⁵ .............................................. G11B 5/09
[52] U.S. Cl. .................................... 360/49; 360/40; 341/59
[58] Field of Search .................. 360/49, 40, 39, 51, 360/41, 42, 77.01, 77.02, 77.04, 77.05, 78.01, 78.04, 78.05, 78.06, 78.08, 78.09, 78.14, 48; 341/59; 369/59

[56] References Cited

U.S. PATENT DOCUMENTS

| | | | |
|---|---|---|---|
| 4,488,142 | 12/1984 | Franaszek | 360/40 X |
| 4,501,000 | 2/1985 | Immink et al. | 375/25 |
| 4,669,004 | 5/1987 | Moon et al. | 360/77 |
| 4,675,652 | 6/1987 | Machado | 340/347 DD |
| 4,688,016 | 8/1987 | Fok | 360/39 X |
| 4,719,523 | 1/1988 | Kutaragi | 360/51 |
| 4,752,841 | 6/1988 | Syracuse et al. | 360/49 |
| 4,868,690 | 9/1989 | Minuhin et al. | 360/51 |
| 4,933,786 | 6/1990 | Wilson | 360/78.14 |
| 5,170,299 | 12/1992 | Moon | 360/77.08 |

FOREIGN PATENT DOCUMENTS 0420179  4/1991  European Pat. Off. .

OTHER PUBLICATIONS

F. Jorgensen, Handbook of Magnetic Recording 3rd Ed. ©1988 Tab Books, p. 683.

McCullough, Ryals, "Hard and Floppy Disks Plus Tape Obey Disk Control Chip Duo", *Electronic Design*, vol. 33, No. 2, Jan. 24, 1985, pp. 185-194.

Khu, Sterner, "PLDs Implement Encoder/Decoder for Disc Drive," *Elect. Design News*, vol. 31, No. 19, Sep. 18, 1986, pp. 285-294.

Howell, "Analysis of Correctable Errors in IBM 3380 Disk File" *IBM J. Res & Develop.*, vol. 28, No. 2, Mar. 1984 pp. 206-211.

Matsumoto, "A 48 MB/s Disk Drive Data Separator," *Proc.* 1990 Bipolar Circuits & Tech. Mtg. No. 2.4, Sep. 17, 1990 Minneapolis, MN pp. 52-55.

*Primary Examiner*—Robert J. Pascal
*Assistant Examiner*—Ali Neyzari
*Attorney, Agent, or Firm*—David B. Harrison

[57] ABSTRACT

A method is provided for decoding a unique data sequence forming an address mark within a stream of RLL coded data values in order to start a byte clock for synchronizing operations within a data sequencer of a data storage system. The unique data sequence nominally comprises at least two adjacent sequences of zeros of a maximum permitted length occurring between three flux transitions under a predetermined RLL data code. This new method comprises the steps of:

detecting a first flux transition, detecting a second flux transition, determining the number of zeros of a first zero sequence from the first flux transition to the second flux transitions, determining if the accumulated number of zeros of the first zero sequence is equal to the maximum permitted length, plus or minus one zero, and if so, detecting the third flux transition, determining the number of zeros of a second zero sequence from the second flux transition to a third flux transition, summing the numbers of zeros of the first and second sequences, determining if the sum is of the maximum permitted length, plus or minus one zero, and if so, starting the byte clock in relation to the determined first and second sequences and in relation to the time of detection of the third flux transition.

20 Claims, 13 Drawing Sheets

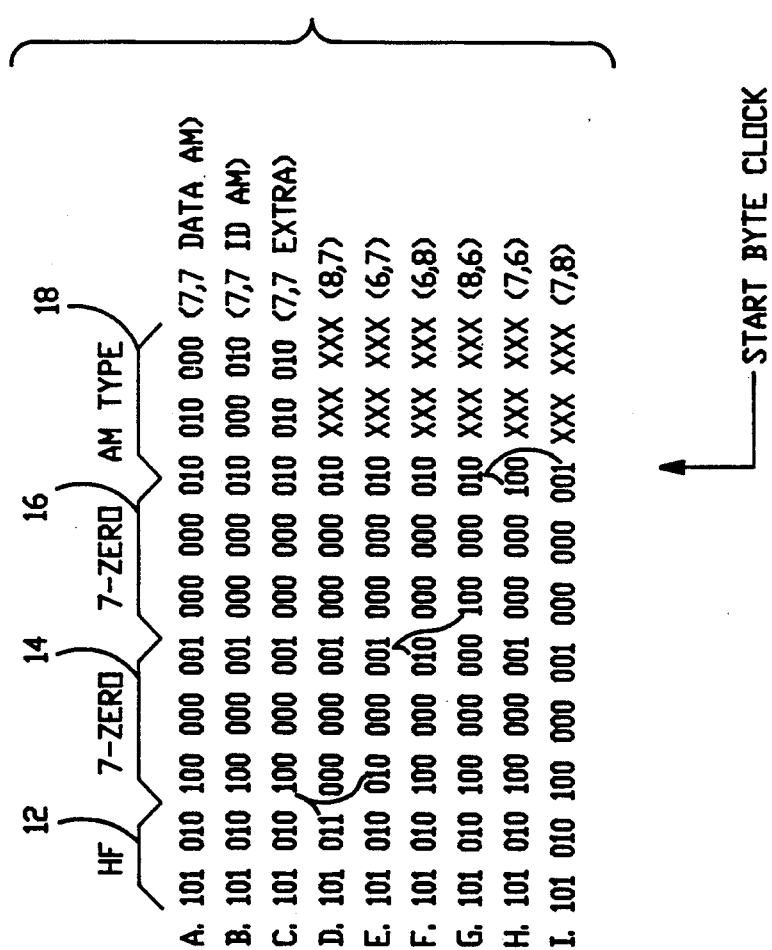

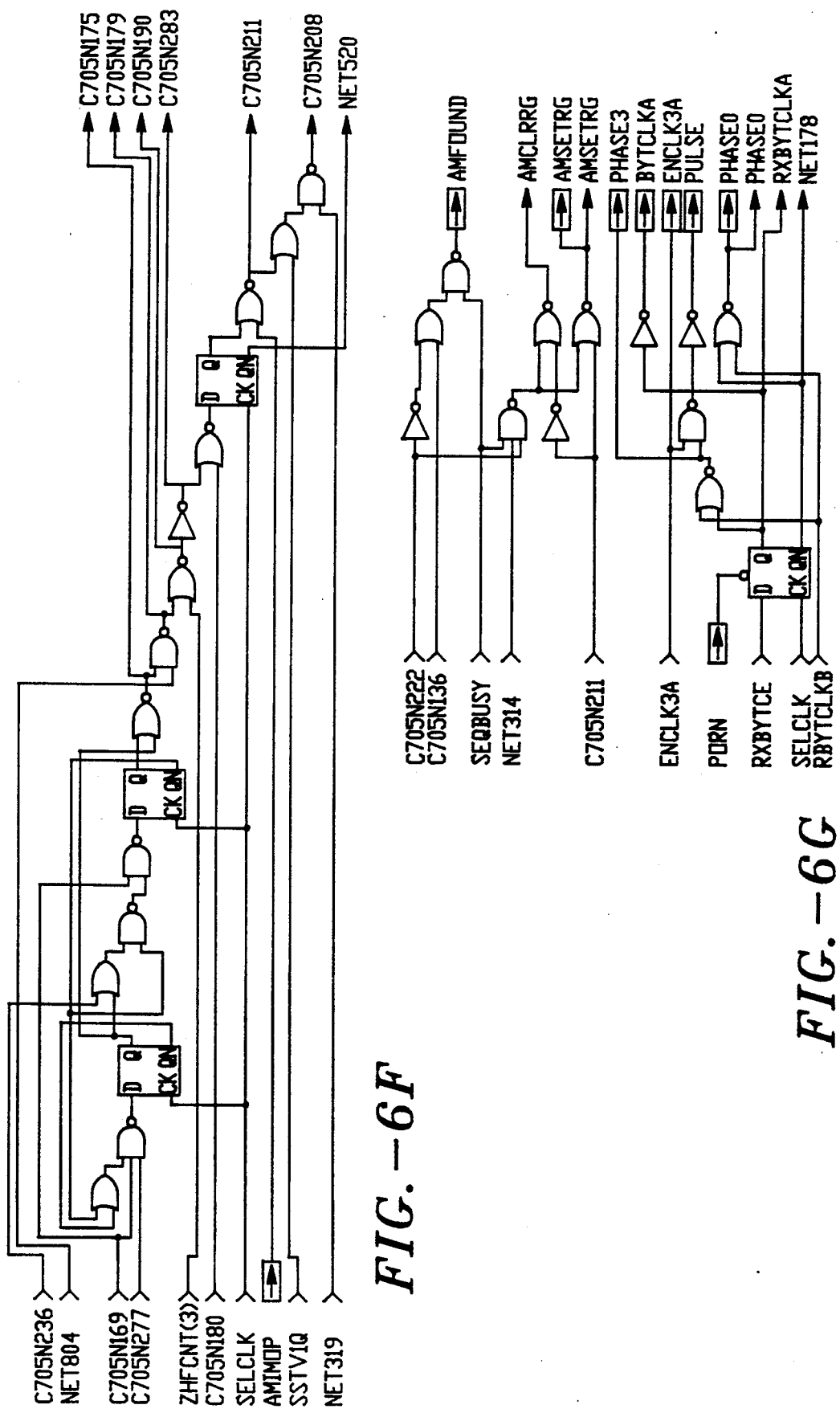

FAULT TOLERANT RLL DATA SECTOR ADDRESS MARK DECODER

FIELD OF THE INVENTION

The present invention relates to signal processing within computing systems. More particularly, the present invention relates to a fault tolerant decoder for decoding RLL coded data field address marks employed to mark the beginning or resumption of blocks of data being transferred between storage elements, particularly those associated with disk drive data storage subsystems.

BACKGROUND OF THE INVENTION

In computing systems, user data is frequently arranged as a stream of blocks of fixed length. Commonly encountered block lengths are 256 bytes, 512 bytes, 1024 bytes, etc. In addition, each block typically includes overhead information, such as a block or sector identification number. In the case of disk drives, data blocks stored on a storage surface typically are stored as "sectors" or segments of a data track. There are many data tracks typically arranged as concentric bands. A data transducer head is moved by a positioning system from track to track during track seeking operations, and is held in alignment with the track during track following operations. The block identification number for a data sector typically may include a head number to indicate a particular data storage surface or area, and a sector number to identify the particular data sector on that surface.

Sometimes, and particularly with prior disk drives having limited data storage capacity, the data sectors of fixed block length are aligned radially; and, a developed disk storage surface would reveal such sectors to be like pie-shaped wedges. A sector detection scheme can then be employed to mark the location of each sector. When each sector location is fixed and invariant even during disk surface formatting operations, the scheme is referred to as "hard sectoring". When the sector location may vary, depending upon variable parameters provided for a disk surface formatting operation for example, the scheme is generally referred to as "soft sectoring." The present invention is particularly applicable to soft sectoring of data sectors in a disk drive.

Disk drives employing 1,7 RLL coding schemes with embedded servo sectors are known in the prior art. Examples are discussed in commonly assigned U.S. Pat. Nos. 4,669,004 and 4,675,652, the disclosures of which are incorporated herein by reference. In the disk drive described in the referenced '004 patent, a hard sector scheme was employed. The head positioner servo always knew where the sectors were located as the storage disk rotated. After each servo sector, a data field or block would follow. All that was needed was a flag byte which marked the end of the sync field and start of the data field.

The expression "RLL" stands for run-length-limited. By "1,7 RLL" is meant that after a flux transition there may be between one and seven data clock periods or "cells" without a flux transition before another flux transition must be received. Thus, if a flux transition within a cell is denoted a "1", and the absence of a flux transition within a cell is denoted "0", from a 1 to a 1 there may be between one and seven zeros in the 1,7 scheme. In this scheme, typically groups of three cells are used to decode two data bits, and it is sometimes referred to as a "three-to-two" code. A data compression ratio of four to three is achieved with this particular data coding arrangement.

It is known that aerial data storage densities vary from radially outward data tracks to radially inward data tracks. This differential or gradient is due to the fact that the head to disk relative velocity varies from a maximum at the radially outward tracks to a minimum at the radially inward tracks. Also, the outer tracks have a greater lineal length than the inner tracks. It is thus clear that more data can be physically packed into the radially outward tracks than can be made to fit within the radially inward tracks.

One proposed solution to the data storage inefficiencies associated with this differential or gradient is to adjust the data transfer rate across the data storage surface. While this approach may be made to work well, one drawback is that it becomes very complicated and cumbersome to keep track of servo data from outer to inner tracks if the servo data rate is varying. This is a particularly challenging problem during track seeking operations, where access times become critical. Another approach is to divide the data tracks into zones and adjust data transfer rates of each zone. This approach has similar problems and drawbacks.

A third approach is to employ the zoned tracks concept, but also to provide for regularly aligned servo sectors spaced as spokes extending outwardly from the disk hub to the outer circumference wherein the servo sectors interrupt the data tracks and data fields. The result is a scheme known as "split data field recording". The present invention has particular applicability to split data field recording schemes.

A mechanism must be provided to mark in time the beginning of a data block. One way to implement such a mechanism is to provide a unique pattern, referred to herein as an "address mark". Detection of the address mark provides a basis for restarting a byte clock within a data sequencer which enables appropriate framing of incoming bytes from the disk surface during data readback operations. The byte clock must be started in synchronism with the incoming data pattern before the serial by bit data stream may be properly decoded and framed as data bytes. Provision of, and detection in real time of, the address mark pattern provides a synchronising mechanism used by the data sequencer.

Whenever data fields are split up or are located differently than are embedded servo sectors, an address mark must be provided to mark the beginning as well as resumption of the data field. The address mark must be unique in the sense that it should not be mistakenly decodable as data. The data address mark should be consistent with any coding scheme, such as 1,7 run length limited (RLL) coding which is used to compress data before it is recorded on the disk surface. A suitable data address mark for marking the beginning of, or resumption of, a data field is one which is consistent with the coding scheme, such as 1,7 RLL, but which will not mistakenly decode to user data.

In high density recording schemes, the most likely error is bit-shift. Bit-shift is a data distortion which occurs when a flux transition (i.e. "bit") is shifted and looks as if it is located in another, typically adjacent, data clock increment or cell. Bit shifts are caused by normal read/write noise. Peak shift is another cause; and, it most frequently occurs when flux transitions are close together on one side but far apart on another opposite side. In this case the transitions tend to migrate away from each other. Bit shift is a particular problem which confronts the disk drive designer; and, a hitherto unsolved need has arisen for a decoder which decodes data field address marks and manifests tolerance to faults, such as bit shift, while at the same time restarting the byte clock in proper synchronism with unshifted incoming data.

Summary of the Invention with Objects

A general object of the present invention is to provide an address mark decoder for decoding data field address marks in a manner which overcomes limitations and drawbacks of the prior art.

Another object of the present invention is to provide a data address mark and decoder for the same which is single bit shift fault tolerant, or not, depending upon the setting of a control line.

Yet another object of the present invention is to provide a fault tolerant data address mark pattern and decoder which tolerates single bit shifts within a predetermined data address mark pattern while starting a byte clock of a data synchroniser in proper synchronism with incoming data read back from the disk surface.

Another object of the present invention is to monitor an incoming data stream to detect whether a last flux transition of an address mark has been shifted relative to the other data, and thereupon advance or delay the start of a byte clock by the amount of the shift, so that user data bytes may subsequently be properly framed from the incoming serial data stream from the data surface.

A further object of the present invention is to implement a fault tolerant data address mark pattern and decoder which decodes a plurality of different data address marks.

Yet another object of the present invention is to implement a fault tolerant data address mark decoder which is consistent with a predetermined data coding scheme, such as 1,7 RLL coding, but wherein the address mark pattern is uniquely identifiable as compared to the normal user data patterns.

One more object of the present invention is to provide a fault tolerant data address mark pattern and decoder which is particularly well suited for use within a disk drive employing split data fields.

In one facet of the present invention a storage medium defines a unique bit shift tolerant address mark pattern for marking the beginning of a block of data stored within a data storage device, the data being encoded in accordance with a predetermined code, the address mark pattern being one included within code boundaries of the predetermined code, the address mark pattern not resulting from encoding of data in accordance with the predetermined code, and the address mark pattern not resulting from encoding of data in accordance with the predetermined code plus or minus a single bit shift occurring during playback.

As an aspect of this facet of the invention, the predetermined code is 1,7 RLL, and the address mark pattern nominally comprises:

10 000 000 100 000 001 ("7,7") wherein "1" denotes a flux transition within a clock cell, and "0" denotes the absence of a flux transition within a clock cell, and additionally comprises single bit shift fault tolerance patterns including:

010 000 001 000 000 010 (6,7);
1 000 000 001 000 000 010 (8,7);
100 000 010 000 000 010 (6,8);
100 000 000 100 000 010 (8,6);
100 000 001 000 000 100 (7,6); and,
100 000 001 000 000 001 (7,8).

As another aspect of this facet of the invention, a field of preamble pattern precedes said address mark pattern. Preferably, the preamble pattern comprises a repeating pattern of one and zero clock cells.

As a further aspect of this facet of the invention, an address mark type pattern field follows the address mark pattern wherein the address mark type pattern identifies at least an ID header address mark, and a data header address mark.

As one more aspect of this facet of the invention, the storage medium comprises a magnetic data storage surface of a rotating disk.

As another facet of the present invention, a method is provided for decoding a unique data sequence forming an address mark within a stream of RLL coded data values in order to start a byte clock for synchronizing operations within a data sequencer of a data storage system, the unique data sequence nominally comprising at least two adjacent sequences of zeros of a maximum permitted length occurring between three flux transitions under a predetermined RLL data code. This new method comprises the steps of:

detecting a first flux transition,
detecting a second flux transition,
determining the number of zeros of a first zero sequence from the first flux transition to the second flux transitions,
determining if the accumulated number of zeros of the first zero sequence is equal to said maximum permitted length, plus or minus one zero, and if so,
detecting a third flux transition,
determining the number of zeros of a second zero sequence from the second flux transition to the third flux transition,
summing the numbers of zeros of the first and second sequences,
determining if the sum is of the maximum permitted length, plus or minus one zero, and if so,
starting the byte clock in relation to the determined first and second sequences and further in relation to the time of detection of the third flux transition.

As an aspect of this facet of the invention, the data stream includes a predetermined preamble of alternating flux transitions and zeros, and the method comprises the further step of detecting the predetermined preamble which includes the step of detecting said first one of the flux transitions.

As another aspect of this facet of the invention, the RLL code comprises a 1.7 RLL code in which there may be no fewer than one zero between flux transitions nor more than seven zeros between flux transitions.

As a still further aspect of this facet of the invention, the unique data sequence nominally comprises 10 000 000 100 000 001 (7,7) and the method detects patterns comprising:

010 000 001 000 000 010 (6,7);
1 000 000 001 000 000 010 (8,7);
100 000 010 000 000 010 (6,8);
100 000 000 100 000 010 (8,6);
100 000 001 000 000 100 (7,6); and,
100 000 001 000 000 001 (7,8).

As another aspect of this facet of the invention, the data stream includes a predetermined pattern of postamble data following said unique pattern, and the method comprises the further step of decoding said predetermined pattern of postamble data. Preferably, the postamble data pattern comprises a plurality of bit-shift tolerant patterns, so that plural address marks may be identified.

As another facet of the present invention, a fault tolerant address mark decoder is provided for a data sequencer of a disk drive including a rotating data storage disk, a data transducer for reading blocks of data stored in concentric data tracks formed on a storage surface of said disk, the data being coded in accordance with a predetermined RLL code. The new decoder detects a unique data sequence forming an address mark within a stream of the RLL coded data wherein the unique sequence is preceded by a predetermined preamble pattern, the unique data sequence comprising at least first and second adjacent sequences of zeros of a maximum permitted length under the RLL code separated by first, second and third flux transitions. Upon detection of the unique data sequence, the decoder starts a byte clock for controlling operations of the sequencer. The decoder preferably comprises a state machine defining a plurality of states:

a first state for detecting the predetermined preamble pattern and for detecting the first flux transition, a second state following the first state for detecting a predetermined plurality of consecutive zeros following detection of the first flux transition, a third state following the second state for accumulating the balance of zeros of the first sequence until the second flux transition is detected, and for determining if the number of zeros of the first sequence is of a maximum permitted length, plus or minus one bit shift, and if so, a plurality of subsequent states for accumulating the second sequence of zeros until the third flux transition is reached, and for determining if the sum of the first and second adjacent sequences equals the maximum permitted length, plus or minus one bit shift, and if so, delaying or advancing the time of transition for signalling detection of said unique data sequence and for starting the byte clock at the proper time as determined by the second sequence.

As an aspect of this facet of the invention, the RLL code comprises a 1.7 RLL code in which there may be no fewer than one zero between flux transitions nor more than seven zeros between flux transitions.

As another aspect of this facet of the invention, the preamble pattern comprises 101 and the unique data pattern nominally comprises 10 000 000 100 000 001 (7,7) and the decoder also detects patterns comprising:
  010 000 001 000 000 010 (6,7);
  1 000 000 001 000 000 010 (8,7);
  100 000 010 000 000 010 (6,8);
  100 000 000 100 000 010 (8,6);
  100 000 001 000 000 100 (7,6); and,
  100 000 001 000 000 001 (7,8).

As one more aspect of the present invention, the 6,7 pattern is detected by the third state and a fourth one of the plural subsequent states and further including a first delay state leading directly to the idle state; the 8,7 pattern is detected by the third state and a fifth one of the plural subsequent states, and further including the first delay state; the 6,8 pattern is detected by the third state and the fourth one of the plural states and further including the first delay state; the 8,6 pattern is detected by the third state and a sixth one of the plural states and further including the first delay state; the 7, 7 pattern is detected by the third state and a seventh one of the plural subsequent states, and further including the first delay state leading directly to the idle state; the 7,6 pattern is detected by the third and the seventh one of the plural subsequent states and further including a second delay state following the first delay state; and, the 7,8 pattern is detected by the third and the seventh one of said plural subsequent states and without including any of the delay states.

As a further aspect of this facet of the invention, a return path is provided from said third state to said first state in the event that the balance of zeros accumulated at said third state is other than the maximum permitted length, plus or minus one bit shift. Also, a plurality of return paths are provided from said plurality of subsequent states if the sum of the first and second adjacent sequences does not equal the maximum permitted length, plus or minus one bit shift.

These and other objects, aspects, advantages and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIG. 2 is a data pattern table illustrating bit shifts which may occur within an exemplary data field address mark pattern in accordance with principles of the present invention.

FIGS. 6A, 6B, 6C, 6D, 6E, 6F, 6G and 6H together represent a logic diagram of digital circuit elements implementing the address mark decoder state machine shown in FIG. 3.

DETAILED DESCRIPTION OF A PREFERRED EMBODIMENT

Figure 1:
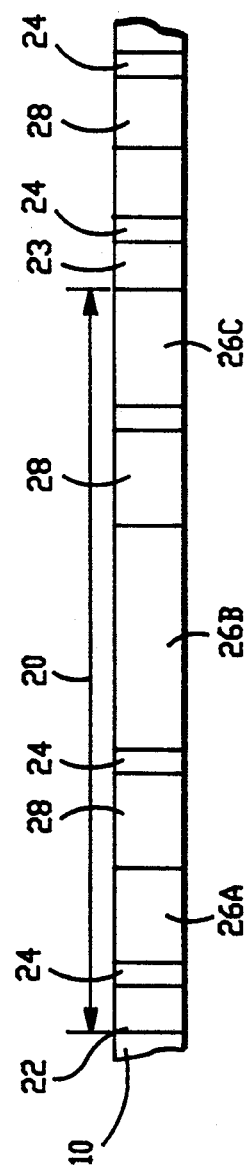
FIG. 1 is a graph of a segment of a data track showing a data field being split into segments by recurrent servo sectors. ID and data headers for the data segments include bit shift correctable ("fault tolerant") address marks in accordance with principles of the present invention. While the FIG. 1 graph is a rectilinear depiction, within disk drives, the tracks are typically concentric, and a truer representation would show the FIG. 1 segment as an arc segment of a circular track pattern.
Figure 5:
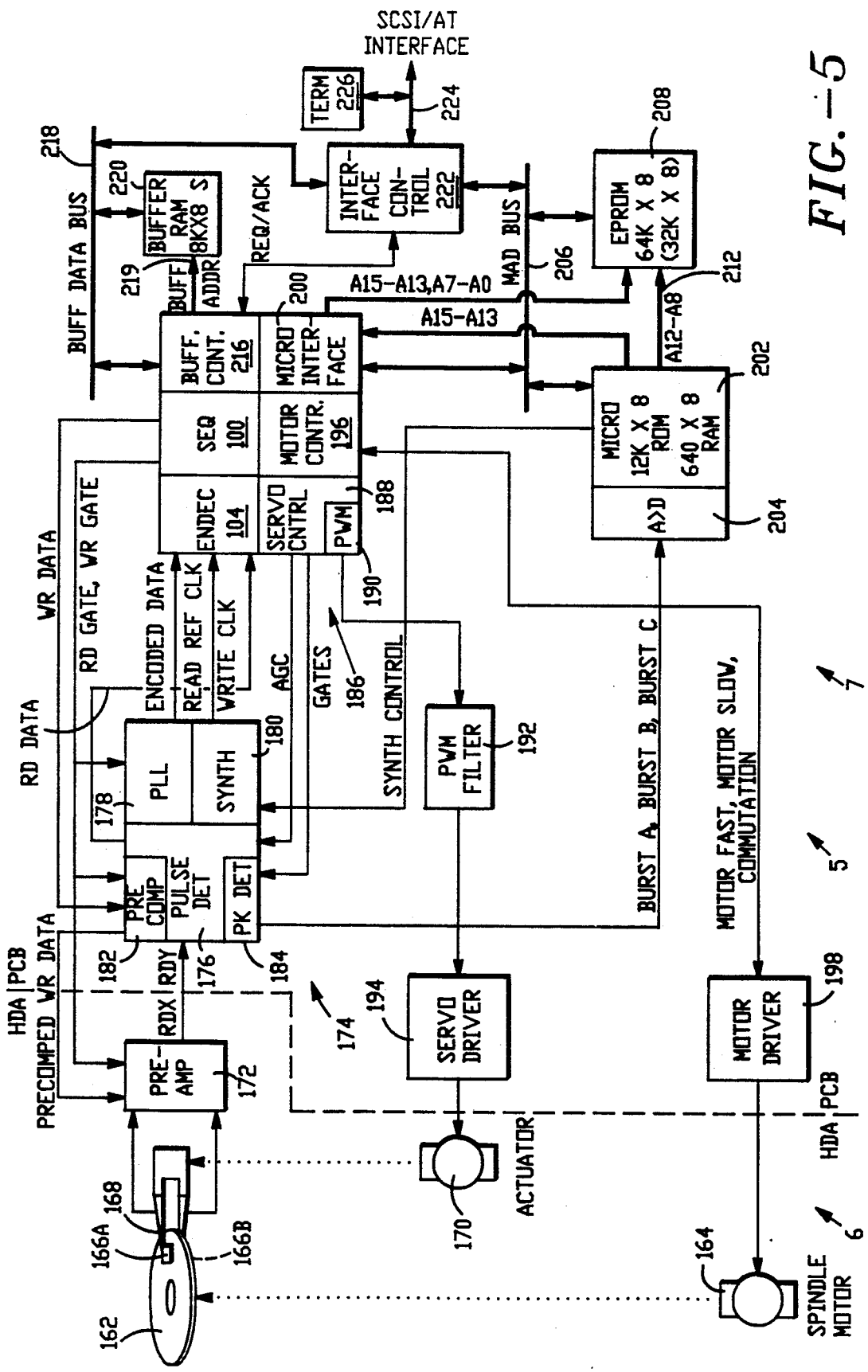
FIG. 5 is a block diagram of a disk drive data storage subsystem including the FIG. 4 data sequencer.
Figure 6A:
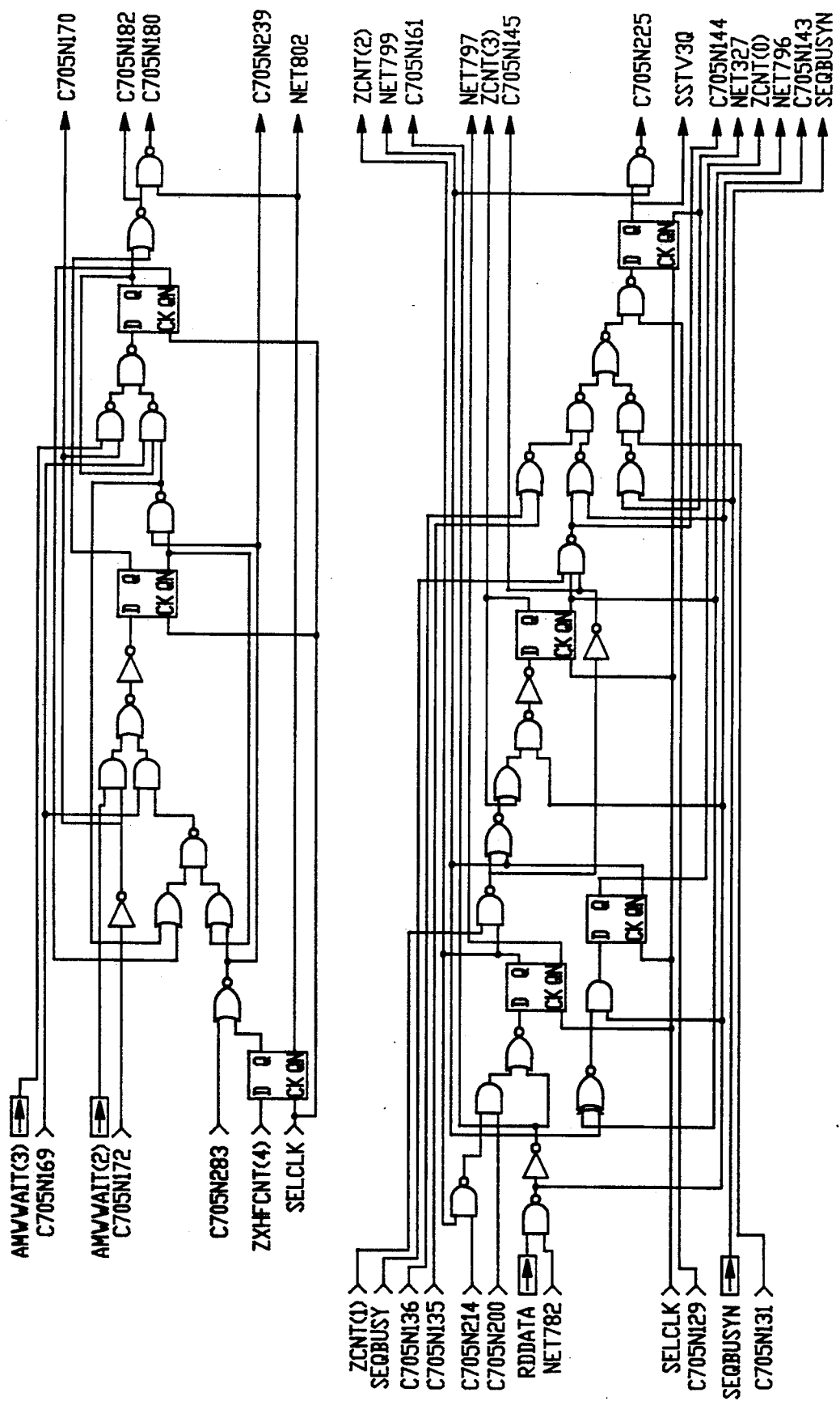
Figure 6B:
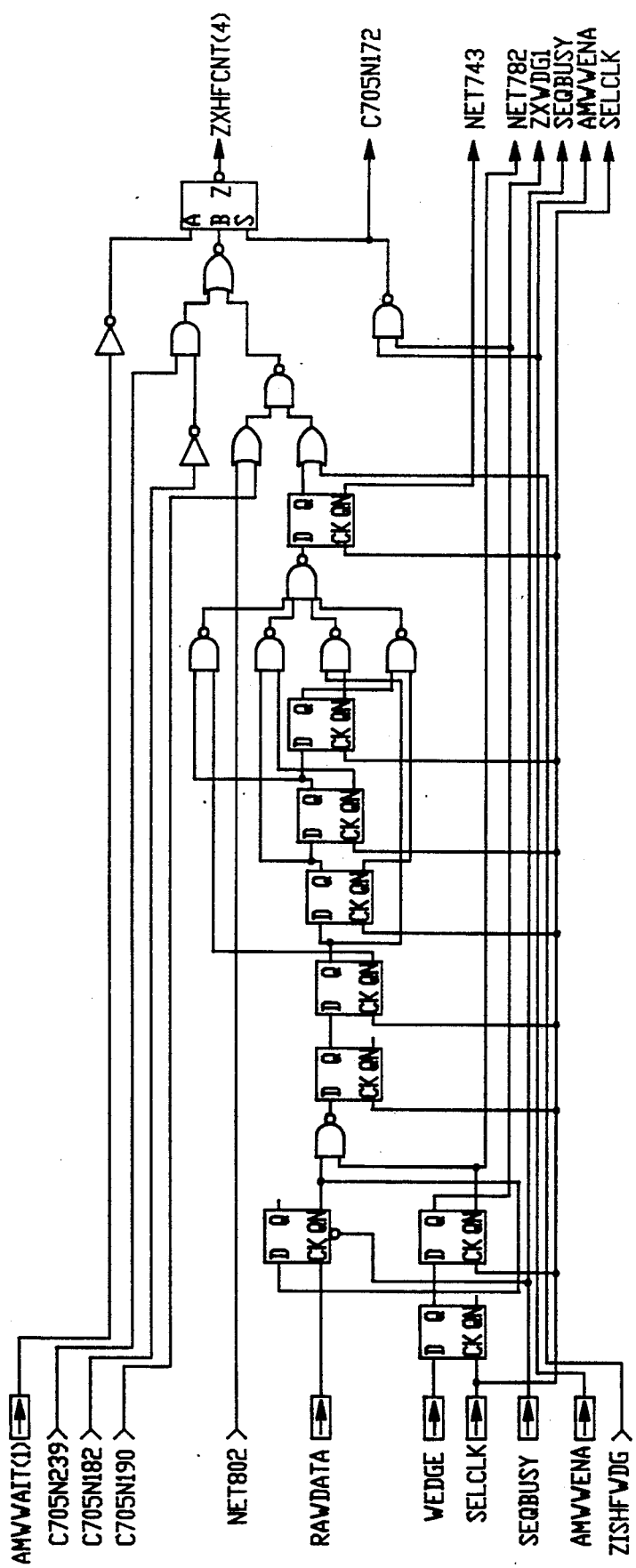
Figure 6C:
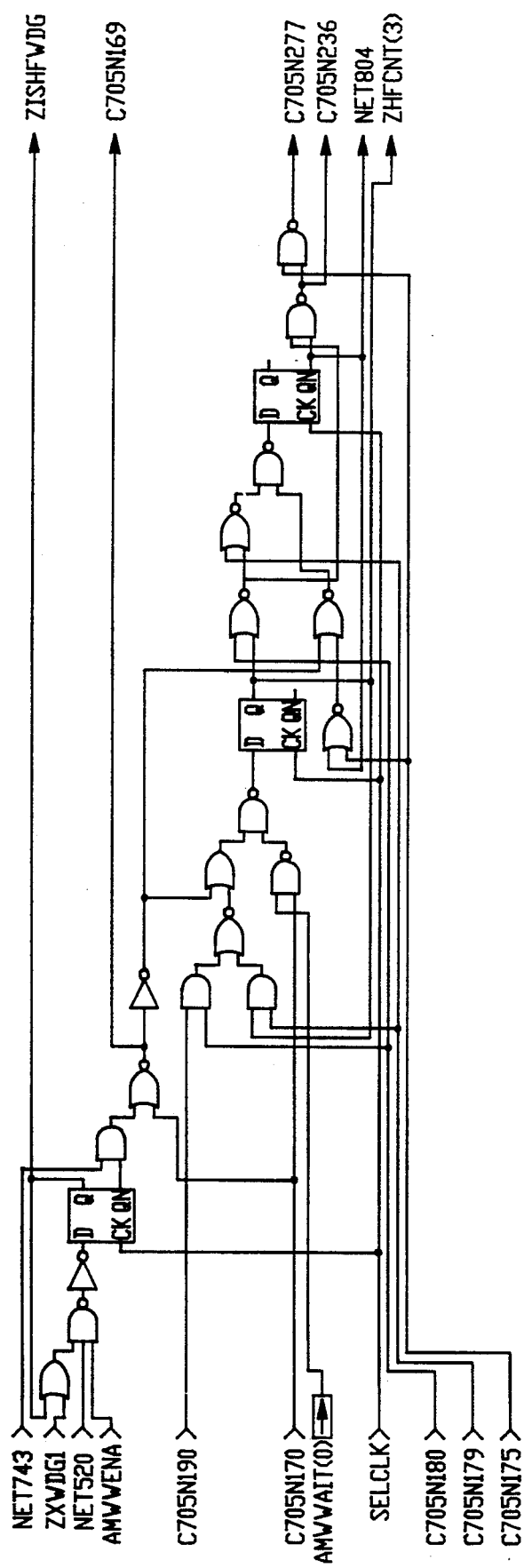
Figure 6D:
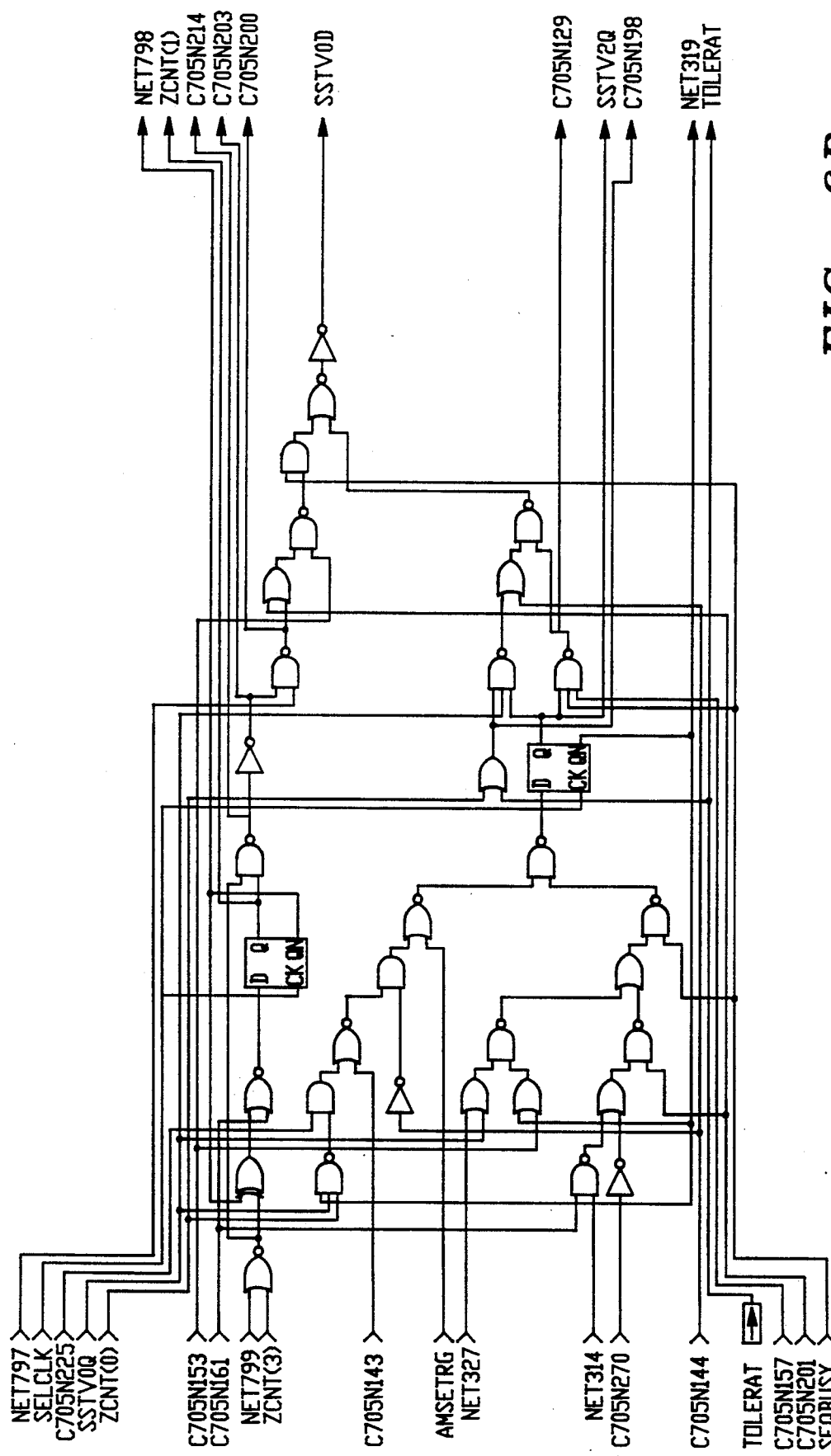
Figure 6E:
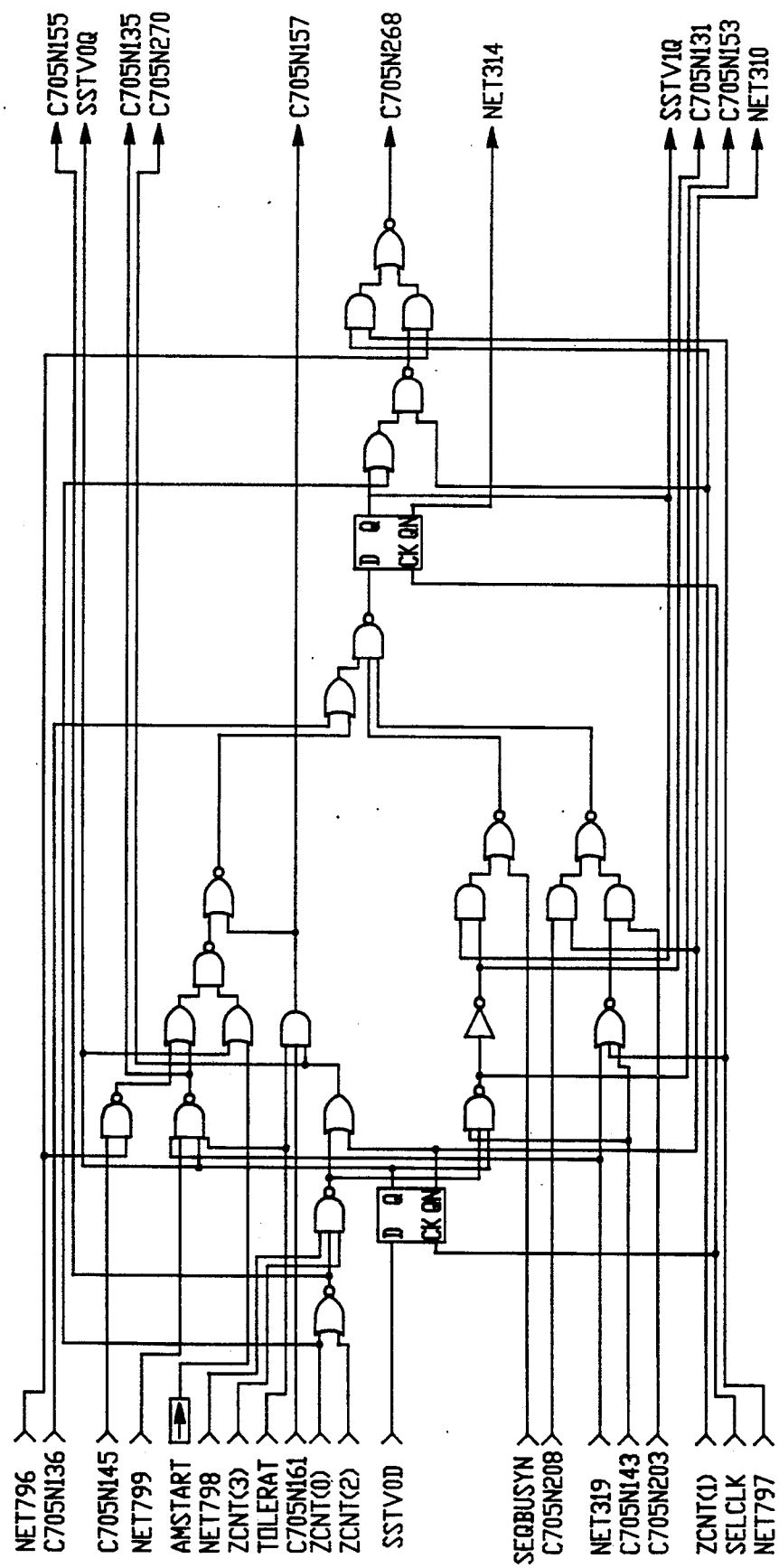
Figure 6H:
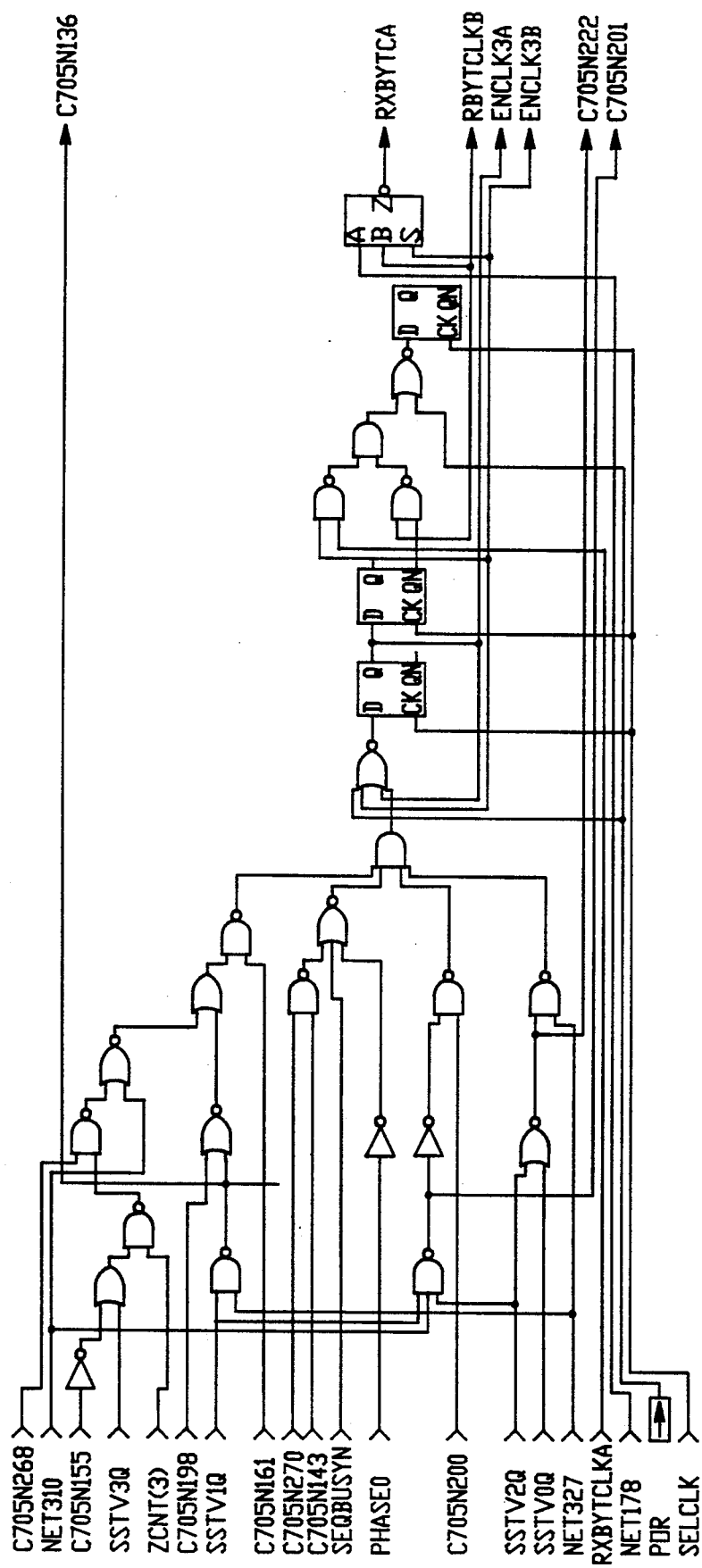

Beginning with FIG. 1, an exemplary data track 10 includes a data block 20 for storage of a predetermined amount of user data, such as 512 or 1024 bytes of user data, recorded serially by 1,7 RLL code bits in data field areas of the depicted track segment. While FIG. 1 depicts the track 10 in lineal format, it is to be understood in the present example that the track 10 is one of a multiplicity of concentric data tracks formed on a storage surface of a rotating data storage disk 162 (FIG. 5).

In order to optimize data storage capacity and to provide a very robust head positioning servo, the data block 20 is interrupted by several servo sectors 28. The servo sectors 28 are e.g. regularly spaced as radial spokes about the circular extent of the data storage surface, and are e.g. recorded at a fixed data rate. Each servo sector 28 contains embedded servo information providing head position information to the disk drive. A data transducer head (not shown) is positionable radially with respect to the data surface by an actuator operating within a head position servo loop in order to read the data and servo information contained in the track 10, for example, as well as some or all of the other data tracks on the particular surface.

Figure 1A:
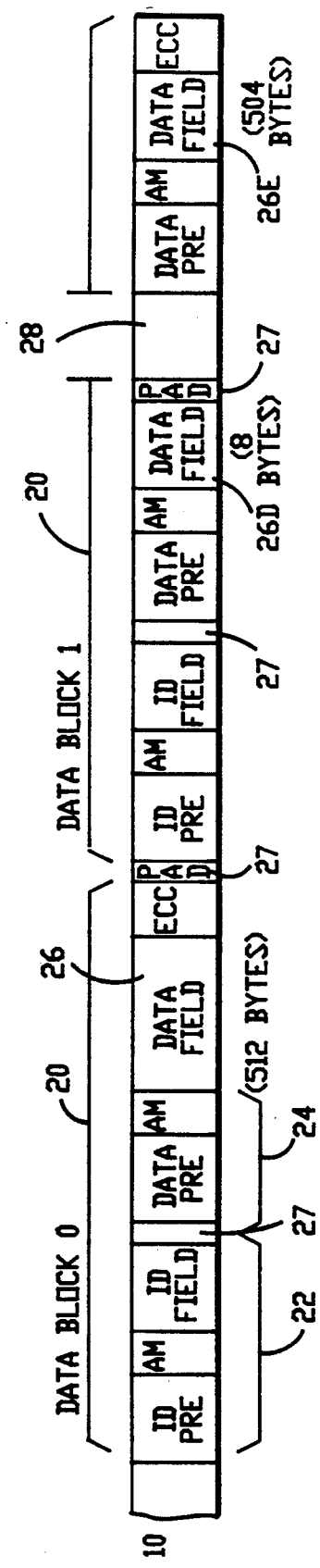
FIG. 1A is a more detailed graph of a segment similar to the FIG. 1 segment showing several split data fields.

The data block 20 includes an ID header 22 at the beginning of each data block; and, if the data block 20 is split up into segments, it preferably includes a data header 24 immediately preceding each user data field segment 26. FIG. 1 shows three split data block segments 26a, 26b, and 26c. These segments 26a, 26b and 26c are formed by being interrupted by the servo sectors 28. As shown in FIG. 1A, the block (sector) ID header 22 typically may include a high frequency preamble field of predetermined length, followed by a block address mark field, followed by an ID field including e.g. a sector number byte and a head number byte, followed by a Reed Solomon error detection code field. Pad fields 27 appropriately provide conventional write splice margins before each data header 24, and may also be provided before at least some of the ID headers 22.

The count bytes of the count byte field within the ID field of the header 22 are used by a data sequencer 100 (FIG. 4) to determine on-the-fly the layout of the particular data block as it is interrupted by the servo sectors. In other words, given the FIG. 1 example, the first data segment 26a of a 512 user byte block might contain 140 bytes; a second data segment 26b might contain 252 bytes; and a third segment 26c might contain 120 bytes. The count bytes might thus be 120, 252 and 140. These bytes are arranged in reverse order, so that they may be pushed onto a byte count stack 142 within the sequencer 100. The last count, 140 bytes, will be the first popped off the stack 142 as the data block 20 is being decoded and properly reassembled in real time by the sequencer 100.

A slightly different example is provided in FIG. 1A. In FIG. 1A, two data blocks 20 are shown, a data block 0, and a data block 1. Data block 0 immediately follows a servo sector 28' which differs from all other servo sectors by containing a once-per-revolution index signal. Thus, the first data block, block 0, immediately follows an internal index marker marking the logical beginning of each data track. In data block 1, the block is split into two data segments 26d and 26e. In this example, the data segment 26d contains e.g. 8 bytes of user data, while the data segment 26e contains the balance, or 504 bytes of the 512 byte block.

The sector and head bytes of the ID field are also used by the sequencer 100 to determine that the correct data location has been found on the disk storage surface. The error detection bytes of the ID field 22 are used to detect whether there are any errors in the count, sector or head bytes, as if there are any errors, erroneous operation of the sequencer 100 may otherwise ensue. A commonly assigned, copending U.S. Pat. application, Ser. No. 07/650,791 filed on Feb. 1, 1991, describes a presently preferred on-the-fly Reed Solomon error correction method and apparatus suitable for processing the error detection bytes. The disclosure of that application is hereby incorporated by reference into this application.

Each user data segment 26 is immediately preceded by a data header 24. The data header 24 includes a preamble field of high frequency preamble data, followed by a data-type address mark. The data header is written with a write operation to the user data segment 26, so that the data which follows the data header will be timed with the data header, and so that the data-type address mark will provide a valid basis for restarting the byte clock which enables the sequencer 100 to decode properly the data bytes being read back from the data surface. Accordingly, a write splice will occur between the ID header 22 and the adjacent data header 24. Other data headers 24 immediately follow each servo sector 28 and precede all other user data segments 26 until the next data block is reached. A pad area is provided between each segment and block.

As shown in FIG. 2, within each ID header 22 and each data header 24, the nominal 1,7 RLL coded data stream includes a high frequency (HF) preamble field 12 which represents flux transitions occurring every other cell period; a first 7 zero pattern field 14, a second 7 zero pattern field 16 and an address mark type field 18. The first and second pattern fields 14 and 16 together provide the address mark pattern.

It is apparent from FIG. 2, that the desired address mark pattern essentially comprises a first 7 zero pattern, immediately followed by a second 7 zero pattern. In this regard, it is desirable that any selected address mark in accordance with the principles of the present invention satisfy three general conditions:

First, the address mark is consistent with the general coding rules of the code being followed. (In the present example, those rules are for 1.7 RLL);

second, the address mark pattern cannot be obtained as a code word from any unencoded data pattern which may be coded in accordance with the coding rules; and, third, in accordance with aspects of the present invention, the address mark pattern cannot be obtained from any unencoded data pattern having a plus or minus bit shift during readback. The 7 zero, 7 zero nominal address mark pattern within a 1,7 RLL coding scheme satisfies these three conditions or criteria.

With reference to FIG. 2, Pattern A, a nominal address mark data pattern in accordance with the present invention is depicted as a stream of incoming data cells (wherein a "1" denotes a flux transition in the cell and a "0" denotes no flux transition in the cell). The incoming data pattern which is read back from a data storage surface of a disk is coded in a predetermined data compression code, such as 1,7 RLL 3,2 wherein the 1,7 denotes that all legal patterns will have a flux transition or "1" between not less than one nor more than seven non-transition cells or "0"s; and, wherein the 3,2 denotes that three patterns decode into two binary data bits. In this particular pattern, although a single 7 zero pattern will decode with another pattern into a legal binary data pattern, two consecutive 7 zero patterns will not decode into any legal binary data pattern. Thus, two consecutive 7 zero patterns form an ideal data address mark pattern for providing a unique mark denoting the presence of an ID header 22 or a data header 24, for example.

In order to distinguish between the ID header 22 and the data header 24, an address mark type field 18 immediately follows the two consecutive 7 zero patterns 14 and 16, and the field 18 provides for two three-cell triads which are used to denote the type of address mark, as being either an ID address mark (Pattern B) or a data address mark (Pattern A). A third pattern within the AM type field 18 (Pattern C) may also be used, for example to mark a data field or segment containing unreliable data due to detection of a media defect, etc. Since the address mark type field 18 comprises two three-cell triads wherein only one of the cells represents a flux transition, single bit shift tolerance is readily provided in this field, too.

Patterns D through I of FIG. 2 illustrate occurrences of single cell bit shifts which may occur within the ID header 22 or the data header 24. For example, an 8 zero, 7 zero AM pattern is shown in Pattern D wherein the bit in the sixth cell has shifted to the fifth cell position. Pattern E shows a 6 zero, 7 zero AM pattern wherein the bit in the sixth cell has shifted to the seventh cell position.

Pattern F shows a 6 zero, 8 zero AM pattern wherein the bit in the fifteenth cell position has shifted to the fourteenth cell position. Pattern G shows an 8 zero, 6 zero AM pattern wherein the fifteenth cell bit has shifted to the sixteenth cell position.

Finally, Pattern H shows a 7 zero, 6 zero AM pattern wherein the bit in the twenty third position has shifted to the twenty second cell position; and, Pattern I shows a 7 zero, 8 zero AM pattern wherein the twenty third cell position bit has shifted to the twenty fourth cell position.

In accordance with principles of the present invention, any one of the six single bit-shifted patterns depicted in Graphs C through I of FIG. 2 will be detected as a legal address mark by a decoder state machine 30. The states of the decoder state machine 30 are shown in the FIG. 3 state diagram. Logic implementing state machine 30 is depicted in FIGS. 6A, 6B, 6C and 6D.

Figure 3:
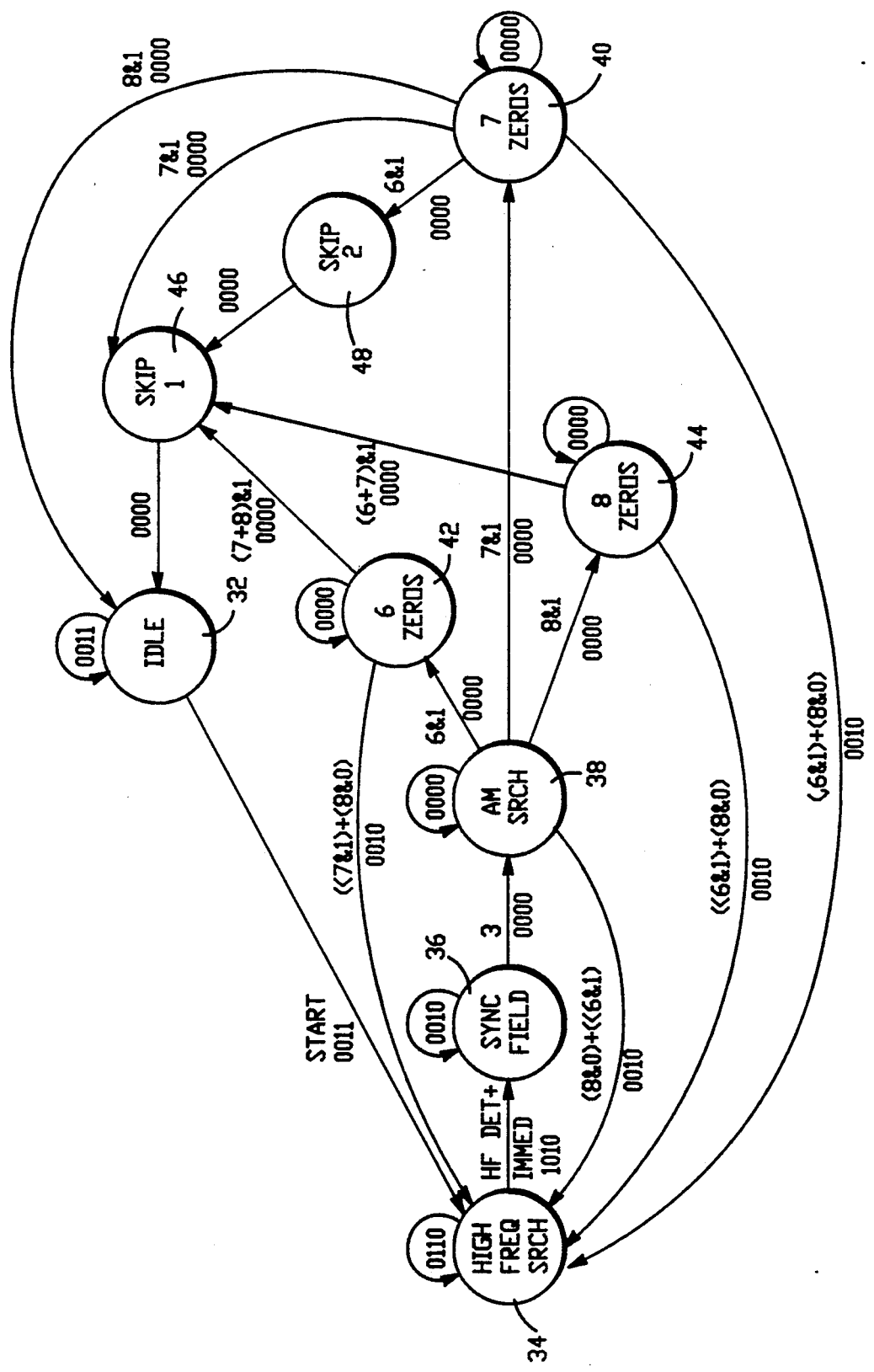
FIG. 3 is a state diagram of an address mark decoder state machine for decoding the data patterns shown in the FIG. 2 table in accordance with principles of the present invention.

Before considering the FIG. 3 state diagram, it should be understood that an address mark control word for controlling the state machine 30 includes e.g. three bits. The first bit position indicates the type of address mark being sought, i.e. whether a data/special case address mark (FIG. 2, Patterns A or C) or an ID address mark (FIG. 2, Pattern B), for example. The second bit of the address mark control word indicates whether the state machine 30 is operating in a search mode or in an immediate mode. In the search mode two bytes of the high frequency pattern 12 will cause a read gate of the data sequencer 100 to go high, and an unsuccessful address mark detection immediately causes the read gate to go low. In the immediate mode, the read gate is set immediately, and never goes low.

The third bit position of the address mark control word indicates that the byte count held in a byte counter 146 is used as a timeout. If not set, the only timeout is a timeout based upon a preset number of once-per-revolution index signals. It should be noted that during a write to disk operation the byte count is ignored, and is always a count of 1.

Normally, the two states that are used are AMIS (ID, Search, No Timeout), and AMDIT (Data, Immediate, timeout enabled).

Turning now to FIG. 3, an idle state 32 is the first state and last state of the address mark decoder state machine 30. The number 0 0 1 1 included within a curved loop arrow indicates that idle state 32 causes an output value signifying that a data sequencer clock is enabled (third bit position "1") and that an address mark has been found (fourth bit position "1").

When a start signal is present, the state machine 30 progresses to a state 34, at which a search begins for the high frequency data pattern, e.g. flux transitions of 101 010, etc. While in state 34 the decoder state machine 30 puts out 0 1 1 0, meaning that the read gate is cleared (second bit position "1") and the byte clock is enabled (third bit position "1"). Upon detection of the high frequency pattern, the state machine 30 progresses to a next state, state 36.

If the decoder state machine 30 is set for immediate mode operation, it immediately progresses from state 34 to state 36, thereby preventing the clearing of the read gate. In state 36, the decoder 30 monitors the data stream in order to detect and end of preamble. In state 3, the decoder output is 0 0 1 0, meaning that the byte clock remains enabled. The end of preamble is detected when three zeros in a row are detected. This zero count nominally represents the first three zeros of the first 7 zero number or pattern of the address mark. After three zeros are detected, the decoder 30 transitions from state 36 to a state 38. During this transition, the Byte Clock is disabled.

In state 38, the decoder 30 begins its search for the address mark sequence, and counts incoming zeros until the next flux transition is detected. In this state the decoder output is 0 0 0 0, meaning that at this state, Byte Clock is disabled, pending detection of the address mark.

There are four possible permitted scenarios: If 7 zeros are followed by a 1, the decoder 30 progresses to a state 40. If 6 zeros and a 1 are detected, the decoder 30 progresses to state 42. If 8 zeros and a 1 are detected, the decoder 30 progresses to a state 44. If less than 6 zeros are detected before the next flux transition, or if 8 zeros are not followed by a flux transition, the decoder 30 returns to state 34 and the byte clock is restarted. In states 40, 42 and 44, the decoder output remains 0 0 0 0, meaning Byte Clock and Read Gate remain disabled.

In state 40, if 7 zeros and a 1 are detected (meaning that a nominal 10 000 000 100 000 001 address mark pattern A or B of FIG. 2 has been detected), the state machine 30 progresses from state 40 to a skip one cell state 46 before reaching the idle state 32. The skip one cell state 46 adds an extra bit cell to the count before restarting the byte clock, so that fault tolerance for a 7 zero, 8 zero pattern (which does not require a delay state) may be provided.

Once the idle state 32 is reached, the sequencer's byte clock is restarted and an Address Mark Found flag is set. If, while the decoder 30 is in state 40, 6 zeros followed by a 1 are detected, the state machine 30 proceeds to a skip two cells state 48. The skip two cells state 48 adds one clock cell to the byte clock startup time. Then, the state machine 30 again passes through the skip one cell state 46 and adds another clock cell before reaching the idle state 32, so that the cumulative delay is two clock states. Thus, in the case of a 7 zero, 6 zero pattern (Pattern H of FIG. 2), two additional clock states are added before the byte clock is restarted at the idle state. Otherwise, this bit shift pattern would have caused the byte clock to start early and incorrectly frame incoming bytes of data within the data stream. If, instead, the detected pattern at state 40 is 8 zeros followed by a 1, a return directly to the idle state 32 is made, as there is no need to add a compensating bit cell to the byte clock which is immediately restarted. If, during state 40, less than 6 zeros or more than 8 zeros are detected, the decoder 30 returns to state 34, and the byte clock is reenabled.

In state 42, if 7 zeros and a 1 are detected (Pattern E of FIG. 2), or if 8 zeros and a 1 are detected (Pattern F of FIG. 2), the decoder 30 progresses through the skip one state 46 to the idle state 32. If the number of zeros detected at state 42 is less than 7 or greater than 8, the decoder 30 leaves state 42 and returns to state 34, and the byte clock is reenabled.

In state 44, if either 7 zeros and a 1 (Pattern D of FIG. 2) or 6 zeros and a 1 (Pattern G of FIG. 2) are found, the state machine 30 proceeds to the skip one cell state 46 and then goes to the idle state 32. If, during state 44 less than six zeros or more than seven zeros are found, the state machine 30 returns to state 34 and the byte clock is reenabled.

The four bit output for the state machine 20 is thus as follows:

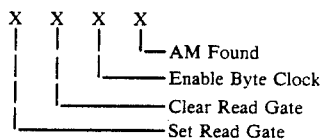

The AM Found output is signalled in the idle state 32 after an address mark has been detected. The Read Gate signal controls a phase locked loop (PLL) 178 within a read channel of a disk drive, such as the disk drive 5 depicted in FIG. 5. Ordinarily, when the drive 5 is not reading data from a data storage disk 162, the PLL 178 is locked to an internally generated write clock signal. This occurs when the Read Gate is cleared.

Basically, the function of the decoder 30 is to detect the beginning of data being read back from the disk 162 and makes use of the address mark sequence in order to perform that detection. Accordingly, after two bytes of high frequency are detected, read gate is turned on (set) (meaning that the PLL is able to lock onto incoming data), and left set until an invalid pattern is detected. Byte Clock is disabled, thereby permitting it to be resynchronized to incoming data. The Byte Clock disabled condition obtains throughout all states directly subsequent to the sync field state 36. If an error overflow condition is detected at or subsequent to the AM search state 38 and a return is made to the high frequency search state 34, Byte Clock is reenabled so that the sequencer 100 begins clocking at the write clock rate. It is important not to keep the Byte Clock disabled, because the microcontroller 202 may wish to write instructions to the sequencer 100 and cannot do so when Byte Clock is disabled.

The skip states 46 and 48 thus provide for adjustment of the start of the Byte Clock, dependent upon the nature and timing of the Address Mark as actually detected. A skip state 46 is added to the nominal 7 zero, 7 zero pattern in order to accommodate the longest permissible bit shifted pattern, i.e., 7 zero, 8 zero. Thus, irrespective of the particular nature of the bit shift within the conditions handled by the decoder 30, Byte Clock will be enabled at precisely the right time in order to begin the recovery of data.

The decoder 30 receives and acts upon a control word. Preferably, the control word is three bits in length. The first bit position indicates 1) that an ID type (Pattern B, FIG. 2) address mark is being sought or 2) that a data type (Pattern A or C, FIG. 2) address mark is being sought. The second bit position indicates 1) if the decoder 30 is in a search mode where two bytes of high frequency will cause the read gate to go high, and an unsuccessful address mark search immediately causes the read gate to go low, or 2) if the decoder 30 is in an immediate mode in which the read gate is immediately set and never goes low. The third bit position indicates that 1) byte count is used as a timeout or 2) byte count is ignored, and the only timeout is based upon a predetermined number of indexes, within a programmable range such as 1-16 indexes ("index" being defined as a once per revolution control signal nominally marking the beginning of a data track).

Normally, the two opcodes most frequently executed by the decoder 30 are "AMIS" which means Address Mark ID mode, Search mode and no timeout, and "AMDIT" which means Address Mark Data mode, Immediate, timeout enabled. These two operating conditions characterize the most frequently occurring situations faced by the decoder 30. The first opcode AMIS is invoked e.g. immediately following a seek operation when the head position servo indicates that the head 166 has settled over a desired track 10. At this point, the AM decoder 30 has no idea where an address mark may be within the data being read from the disk. Accordingly, the AMIS command is executed and a start signal causes the decoder 30 to progress to the preamble search state 34 which looks for two bytes of the high frequency pattern from the preamble field, and then completes the search for the address mark as outlined above.

When a data header 24 is expected immediately following an ID header 22, there is no reason to disable Read Gate, as an invalid address mark is not expected. Accordingly, the AMDIT command causes the decoder 30 to progress from the idle state 32 to the sync field state 36 without stopping at the high frequency search state 34 and without lowering Read Gate. This immediate state permits the PLL to remain locked to data.

Writing of a data field address mark to the disk requires two states. The first state has a write data opcode (WD), lasts for one byte time, and has a data value of 71 Hex. This pattern provides the first half of the two byte address mark. The second state must be an address mark AM opcode with any count forced to 1, and data depending upon the type of address mark, as being ID, (8 EHex) or data (A3Hex) or other (AAHex). The AM opcode disables one transition, forcing the illegal data code pattern to be written as the desired address mark pattern. It should be noted that on a data write wherein the write gate is set, the byte count is ignored, and it is always a count of 1.

The AM decoder 30 internally clocks through its states in accordance with a data clock rate supplied by a frequency synthesizer 180 or directly by the PLL 178. The data rate put out by the synthesizer 180 is commanded by a microcontroller 202 in accordance with a predetermined zone data recording scheme wherein the data tracks 10 are arranged as radial zones with a different data rate being assigned to each zone in order to optimize data storage to magnetic storage domains which vary directly in function of radius of the storage disk 162.

From the foregoing discussion, it is apparent that a very reliable and robust address mark decoder 30 is realized and that it will work successfully to decode address marks manifesting single bit shifts within the data coding pattern and at the same time restart in proper time the byte clock of the data sequencer 100. Further understanding of the decoder 30 may be obtained by considering the following discussion of the data sequencer 100.

Figure 4A:
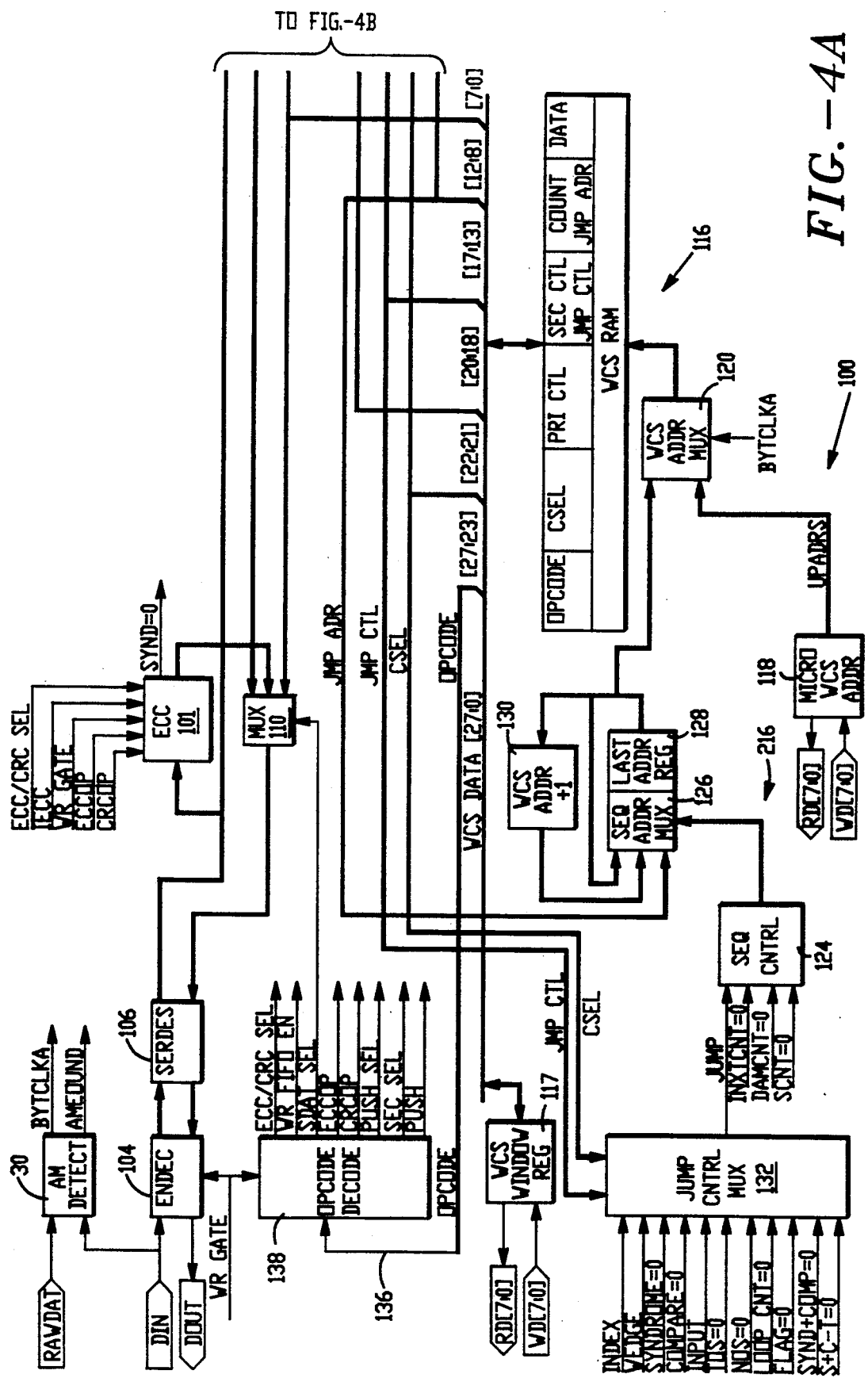
FIGS. 4A and 4B together provide a detailed block diagram of a data sequencer including an address mark decoder in accordance with aspects of the present invention.
Figure 4B:
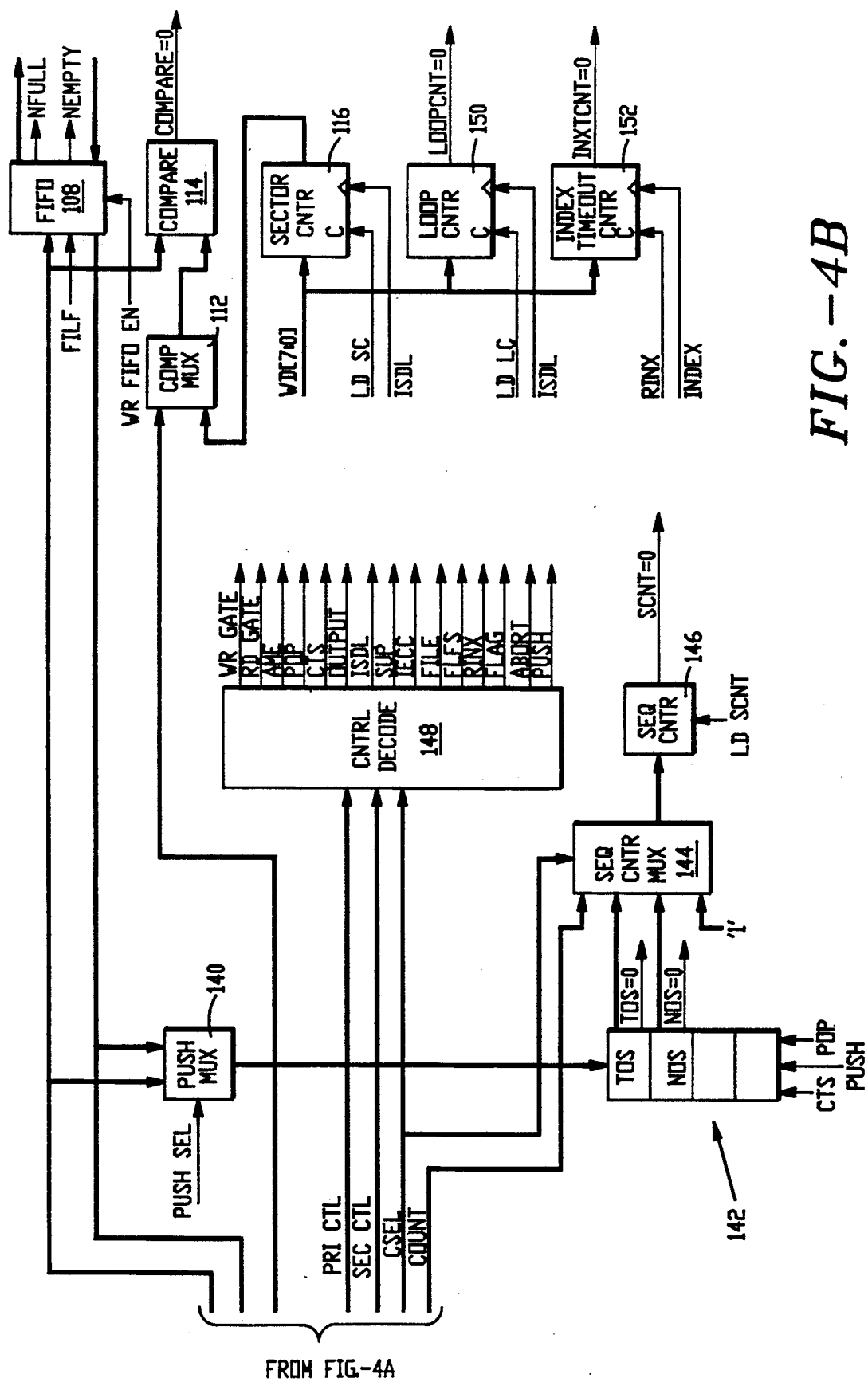

Turning now to FIG. 4, it is to be seen that the address mark decoder 30 is one functional element e.g. within the data sequencer 100 of the disk drive 5 having a bus level interface, such as the drive described in connection with FIG. 5 discussed hereinafter. A disk drive having a SCSI bus level interface and embedded data controller is disclosed in the referenced U.S. Pat. No. 4,669,004, for example. The address mark decoder 30 receives incoming raw data from a pulse detector 176 within a read channel circuit 174 of the disk drive 5.

The decoder 30 looks for a sequence of high frequency flux transitions, and when such is detected, Read Gate is enabled, and the PLL 178 within the read channel circuit 174 is then locked onto the incoming data sequence, and the recovered digital run length encoded data is checked for the presence of the address mark sequence. The FIG. 3 address mark decoder 30 monitors the data stream and signals AMFOUND when each address mark is located. The address mark decoder state machine 30 also starts the byte clock signal BYTCLKA with reference to the flux transition ending the second 7 zero sequence of the address mark pattern. BYTCLKA is defined as the data-in clock DIN divided by twelve and synchronized with detection of the address mark.

A 1,7 run length limited encoder/decoder 104 encodes and decodes serial data into and from the 1,7 RLL code; and, the serializer/deserializer (SERDES) 106 bundles and unbundles data bytes into and from serial 2 bit-by-2 bit format. The encoder/decoder 104 and SERDES 106 are substantially as described in a commonly assigned U.S. Pat. No. 4,675,652 to Machado, the disclosure of which is hereby incorporated by reference. A FIFO byte register 108 enables data bytes to be asynchronously transferred between the sequencer 100 and an external cache buffer memory array 220 of the disk drive 5. The data flowing into and out of the buffer array 220 is clocked by an external crystal clock standard (as opposed to the BYTCLKA which is synchronized with the raw data stream read back from the disk).

A multiplexer 110 regulates bidirectional data flow through the serializer/deserializer 106 and encoder/decoder 104 so that ECC syndrome bytes generated by an ECC generator 101 may be appended to data blocks flowing to the storage surface, and so that data values present on a writeable control store (WCS) bus 134 may also be sent to the disk for storage. The ECC generator 101 is preferably in accordance with the one described in the referenced and incorporated copending U.S. patent application Ser. No. 07/650,791 filed on Feb. 1, 1991.

Reference data sector (i.e. physical sector and transducer head) identification bytes read from data ID fields are passed through a comparison multiplexer 112 to a comparison circuit 114. The comparison circuit 114 compares actual data sector identification bytes received from the SERDES 106 with the reference identification bytes held in a sector counter 116. If a correspondence exists, the desired sector location has been reached, and a Compare=0 control signal is put out by the comparison circuit 114 to a jump control multiplexer circuit 132.

A writeable control store (WCS) 116 provides the dual functions of storing control words which control all of the operational states of the sequencer 100, and of sending out sequencer controls throughout the sequencer 100. The WCS 116 is loaded with information directly read and written by a disk drive microcontroller via a writeable control store window register 117 at internal addresses of the WCS decoded by a microcontroller address decoder 118. During one half of the BYTCLKA clock cycle, a multiplexer 120 enables direct access by the drive microcontroller 202 to the writeable control store 116 via the window register 117.

During the other half of the BYTCLKA cycle, addresses from a sequence controller 122 are used to address the WCS 116. The memory area of WCS 116 includes a series of 28 bit command lines which are executed in sequence. Each command line includes an opcode field, a count select field, a primary control field, two dual purpose fields and a data field. The first dual purpose field contains either a secondary control value or a jump control value; and, the second dual purpose field contains a count field, or a jump address field (if the first dual purpose field is a jump control field).

The sequence controller 122 includes a sequence control decoder block 124 which enables the controller 122 to jump to a plurality of predetermined states, a sequence address multiplexer 126 which selects between various addresses, a last address register 128 for holding the last sequencer address for application to the control store 116 via the multiplexer 120, and a writeable control store address incrementer 130 which feeds back the next address from the one held in the register 128 to the sequence address multiplexer 126.

The sequence control decoder 124 is directly controlled by a jump control multiplexer 132 which generates a jump control signal from a plurality of logical inputs as indicated in FIG. 4 and from jump control codes read from the jump field and count select values read from the count select field of a particular command line stored in the WCS RAM area currently being executed by the sequencer 100.

The 28 bit wide writeable control store (WCS) data bus 134 directly communicates with the writeable control store memory 116 and enables the values held therein to circulate throughout the sequencer 100 along the paths shown in FIG. 4. An opcode bus 136 leads to an opcode decoder 138 which decodes each five bit op code into a plurality of logical conditions on the control lines shown coming out of the opcode decoder 138. The ECC/CRC SEL line, the ECCOP line, and the CRCOP line directly connect to the ECC syndrome generator 101.

A PUSH SEL line extends to a Push multiplexer 140 which enables e.g. data field count bytes C3, C2 and C1 to be pushed directly onto the top of a four byte register stack 142. A top of stack (TOS) bus and a next of stack (NOS) bus connect the stack 142 to a byte sequence counter 146 via a multiplexer 144 which also has the ability to load the sequence counter 146 with "1" values. The byte sequence counter 146 maintains the present byte count for the present state within the sequencer 100. When the presently loaded byte count decrements to zero, the end of a particular sequencer state is reached, and the sequence counter 146 puts out a SCNT=0 value to the jump control multiplexer 132, so that a next state may then be invoked.

A control decoder 148 receives primary control bytes, secondary control bytes, and count select bytes from the writeable control store 116 and decodes these values into specific logical control values which are put out over the control lines shown coming out of the decoder 148 in FIG. 4, including the write gate signal WRGATE and an initialize ECC signal IECC which directly control the ECC syndrome generator 101.

A loop counter 150 is preset with a number of loops to be made during a particular data block transfer transaction (each loop nominally represents the states required to transfer a data block), and generates a LOOPCNT=0 control value when the count reaches zero. This control value signifying that the required number of data blocks has been transferred is also provided to the jump control multiplexer 132. An index timeout counter 152 keeps track of the number of revolutions of the disk 162 a sequencer command takes, generating a timeout value INXCNT=0 which is used to abort the sequence controller 124. A once per revolution index signal stored in the first one of the servo sectors 28 is detected by the servo control circuit 180 and used to clock the index counter 152. Other inputs to the sequence controller are the jump value from the jump control multiplexer 132, the address mark found value AMFOUND from the address mark detector 20, and the byte sequence counter SCNT=0 value from the sequence counter 146.

Further details of the preferred data sequencer 100 are to be found in commonly assigned, copending U.S. patent application Ser. No. 07/710,861, filed on Jun. 4, 1991 and entitled "Miniature Disk Drive Having Embedded Sector Servo with Split Data Fields and Automatic On-The-Fly Data Block Sequencing", the disclosure of which is hereby incorporated herein by reference.

Turning now to FIG. 5, the disk drive 5 includes a head and disk assembly 6 and an electronics assembly 7 contained on a printed circuit board. The data storage disk 162 may have any suitable diameter. While two and one half inches is presently preferred, larger disk diameters, such as three and one half inches, five and one quarter inches, eight inches or larger, or smaller disk diameters, such as 1.8 inch, or smaller, are also clearly within the contemplation of the present invention. The data storage disk 162 is mounted upon a rotating spindle assembly which is rotated by an inspindle brushless DC spindle motor 164 relative to a frame or base.

A plurality of e.g. thin film or MIG data transducer heads 166a and 166b are respectively associated with opposite major data storage surfaces of the at least one data storage disk 162. The data transducer heads 166 are preferably, although not necessarily, mounted to in-line aligned load beams which in turn are attached to vertically aligned arms of an arm assembly 168 of a mass balanced rotary voice coil actuator 170. The heads 166a and 166b operate conventionally in a contact-start-stop relationship with respect to the data surface, and they "fly" above the surface during operations upon an air bearing as is conventional with Winchester fixed disk technology, for example. The heads 166 may be initially loaded onto the data storage disk in accordance with the teachings of commonly assigned U.S. patent application Ser. No. 07/610,306, filed on Nov. 6, 1990, now U.S. Pat. No. 5,170,299, the disclosure of which is incorporated herein by reference.

Magnetic flux transitions comprising both user data and servo sector data 28, are written by or read by the head 166 during data write, data read read, or formatting and servo writing operations. The data read by the head 166 is passed through a write driving functions during data write operations. A conventionally available integrated circuit, such as the SSI 32R4610 four channel thin film head read/write device made by Silicon Systems, Inc., Tustin, Calif., or equivalent, is presently preferred for implementation of the circuit 172. The circuit 172 enables four separate heads 166 to be individually selected, and the circuit 172 is preferably mounted within a space defined within the head and disk assembly 6 upon a Mylar circuit substrate which carries conduction traces leading to connections at an external printed circuit board 7 carrying the other circuit elements of the disk drive 5. The circuit 172 is placed as close to the heads 166 as possible in order to reduce connection lead length, and to improve signal to noise ratios for each of the heads 166.

In FIG. 5 the generally vertical dashed line represents a printed circuit board 7 which carries all of the electronic circuit elements shown in FIG. 5 other than the preamplifier 172, and marks the demarcation between the head and disk assembly 6 and the circuit board 7. As shown in FIG. 5 analog flux transitions from a selected head 166 are amplified by a preamplifier within the circuit 172 and are then passed on to a read channel circuit 174 including a pulse detector 176. Gain of the pulse detector circuit 176 is controlled by an AGC control circuit 184 also contained within the circuit 174.

The pulse detector circuit 176 decodes the analog flux transitions into shaped digital edges or pulses representative of raw encoded data. The circuit 174 also includes a pre-compensation circuit 182 for precompensating data to be written to the disk 10 during data writing operations, and a peak detector 184 for detecting peak amplitudes of servo bursts contained within the servo sectors 28 during track settling operations, track seeking operations, and during track following operations. The circuit 174 also includes the PLL 178 for locking onto incoming data at a data rate predetermined for the particular data zone, as previously explained. A data frequency synthesizer 180 is provided for selectively generating the particular data transfer rate applicable within each one of a plurality of track zones and supplies the synthesized frequency to the PLL 178. The circuit 174 is preferably contained within a single low power VLSI package, such as a type DP8491 made by National Semiconductor Corporation, or equivalent. The circuit 174, as is true with the entire disk drive system 5, operates upon a single +5 volt power supply.

The data stream leaving the circuit 174 enters another circuit 186. The circuit 186 is also a single low power VLSI package operating on a +5V power supply, and it includes a servo data decoder circuit 188. The circuit 186 also includes a pulse width modulator 190 for sending strings of controlled duty cycle pulses generated from values supplied from the microcontroller 202 through a low pass filter 192 to control a servo driver circuit 194. The servo driver circuit 194 generates and applies drive currents to the coil of the rotary actuator 170. Essentially, a digital servo is realized, as described in the reference commonly assigned U.S. Pat. No. 4,669,004. However, there are improvements over that disclosure which are described in copending U.S. Pat.

Applications Ser. Nos. 07/569,065 filed on Aug. 17, 1990, entitled "Edge Servo For Disk Drive Head Positioner", now U.S. Pat. Nos. 5,170,299, and 07/710,172 filed on Jun. 4, 1991, and entitled "Servo Data Recovery Circuit for Disk Drive Having Digital Embedded Sector Servo", the respective disclosures of which are hereby incorporated by reference.

The servo data decoder circuit 188 includes a synchronizer for synchronizing incoming raw data to an internal clock, a sync and unique pattern detector slave state machine for detecting servo sync and a unique pattern within a servo address mark field, a data reader slave state machine for decoding data bits included within the servo address mark field, an index bit field, and a Gray coded data field indicating the particular surface and track number. The circuit 188 also includes a sector timer which generates and puts out expected servo sector times within the circuit 186 based upon detection of each servo address mark, and a delay timer for timing delay periods associated with centerline burst fields included within each servo sector, and for putting out delay gates, the gates being used to control operation of the peak detector 184. Functional operations within the servo decoder circuit 188 are managed and supervised by a servo master state machine which monitors the slave state machines and determines detection of the servo address mark, an index mark, and collects the bits comprising the Gray coded track identification number. This number is passed onto the microcontroller 202 which decodes it and determines head position during track seeking and setting operations of the drive.

The circuit 186 also preferably includes the encoder/decoder 104 and the data sequencer 100, previously described in conjunction with FIG. 4.

The buffer controller 216 controls operation of a buffer memory 220. While conventional, the buffer controller 216 includes a microcontroller buffer access circuit enabling the microcontroller 202 to write bytes to, and read bytes from, specified addresses in the buffer memory 220 in accordance with values supplied over a microcontroller address/data bus 206 leading to a microcontroller interface 200 within the circuit 186 and further via a buffer data bus 218 leading from the buffer controller 216 to the buffer memory 220 and also to an interface controller circuit 222. An address control generates and applies addresses to the buffer memory 220 over a buffer address bus 219. In a similar manner, the sequencer 200 and the interface controller circuit 222 can access the buffer memory 220. A master control state machine within the control 216 generates the necessary clocks for clocking data blocks into and out of the buffer memory 220 and supplies those clocks to the address control. A bus multiplexer within the buffer controller 216 selects between data from the sequencer FIFO 108 and the microcontroller buffer access circuit.

The circuit 186 further includes a motor control circuit 196 which monitors disk rotational speed in accordance with revolution signals supplied e.g. by the motor driver circuit 198, or alternatively by counting the time between index marks provided by the servo control circuit 188. Speed up or slow down signals are sent by the motor control circuit 196 to the spindle motor driver 198. Finally, the circuit 186 includes the microprocessor interface 200 which connects directly to an internal control bus structure 206 over which control data and control address values are sent to and from the programmed digital microcontroller 202.

The interface controller circuit 222 includes bus drivers and other circuitry, such as a data FIFO buffer for buffering data flow from an external bus 224 and the buffer memory 220. The controller circuit 222 may also include one or more state machines for decoding bus level commands. Internal registers may be provided for receiving commands from the microcontroller 202.

The interface controller circuit 222, while conventional, is preferably configured to conform to the ANSI standard X3T9.2/82-2 Revision 17B at conformance level 2 for the small computer standard interface (SCSI), for example. It is controlled by a SCSI interface service routine executed by the microcontroller 208. The interface controller circuit 222 includes hardware for controlling all critical timing operations on the SCSI interface bus. Decoding of commands, time-outs, and other non-critical timing operations are performed by the SCSI service routine. The interface controller circuit 222 also includes on-board drivers for at least a single ended SCSI bus 224. An external resistor termination pack 226 may be provided to terminate the SCSI bus 224.

The microcontroller 202 puts out addresses over an address bus 214 to the microcontroller interface circuit 200. The microcontroller 202 directly addresses a program memory 208 over an address bus 212, and the circuit 200 latches and presents other ones of the address lines to the program memory 208 over an address bus 210.

Preferably although not necessarily, the programmed microcontroller 202 is a single monolithic microcontroller such as the NEC 78322, or equivalent, operating in a two-phase time divided arrangement per servo sector wherein a first time interval upon the arrival of each servo sector is devoted to servo control operations for head positioning, with a second and following time interval devoted to other tasks, including error correction operations, for example. An overview of this form of disk drive architecture is provided in the referenced U.S. Pat. No. 4,669,004. A hierarchical system for managing the tasks performed by the microcontroller 162 during the second and following time interval is disclosed in commonly assigned U.S. Pat. No. 5,005,089, the disclosure of which is hereby incorporated by reference.

An analog to digital converter 204 within the microcontroller 202 enables peak values detected by the peak detector 184 to be digitized and processed most preferably in accordance with a method described in the referenced co-pending U.S. Patent Application Ser. No. 07/569,065, now U.S. Pat. No. 5,170,299, reference to which is made for further particulars.

Further details of a presently preferred implementation of the disk drive 5 are to be found in commonly assigned, copending U.S. Patent Application Ser. No. 07/710,171 filed on Jun. 4, 1991, and entitled: "Miniature Fixed Disk Drive", the disclosure of which is hereby incorporated herein by reference.

FIGS. 6A, 6B, 6C, 6D, 6E, 6F, 6G, and 6H together represent combinatorial logic defining one embodiment of the fault tolerant address mark decoder state machine 30. Decoder inputs are shown in rectangular blocks (arrow in block pointing toward circuit), and decoder outputs are shown in rectangular blocks (arrow in block pointing away from circuit).

Having thus described an embodiment of the present invention it will be readily apparent to those skilled in the art that many widely varying embodiments and applications will suggest themselves without departing from the spirit of the present invention, the scope thereof being more particularly defined by the following claims. The disclosures and the description provided hereinabove are by way of illustration only and should not be construed as limiting the scope hereof.

What is claimed is:

1. A method for decoding a unique data sequence forming an address mark within a stream of run length limited coded data values in order to start a byte clock for synchronizing operations within a data sequencer of a data storage system, the unique data sequence nominally comprising at least two adjacent sequences of zeros of a maximum permitted length occurring between three flux transitions under a predetermined run length limited data code, the method comprising the steps of:

detecting a first one of the flux transitions,
    detecting a second one of the flux transitions,
    accumulating the number of zeros of a first one of said sequences between said first one of the flux transitions and the second one of the flux transitions,
    determining if the accumulated number of zeros is equal to said maximum permitted length, plus or minus one zero, and if so,
    detecting a third one of the flux transitions,
    accumulating the number of zeros of a second one of said sequences between the second one of the flux transitions and the third one of the flux transitions,
    determining if the sum of the first and second ones of said sequences of zeros are of said maximum permitted length, plus or minus one zero, and if so,
    starting said byte clock in relation to the determined sum and in relation to the time of detection of the third one of the flux transitions.

2. The method set forth in claim 1 wherein the data stream includes a predetermined preamble of alternating flux transitions and zeros and comprising the further step of detecting a predetermined minimum amount of the preamble prior to detecting the first one of the flux transitions of the unique data sequence.

3. The method set forth in claim 1 wherein said first one of said flux transitions is identified as such by counting three zeros in a row immediately following detection of said first one.

4. The method set forth in claim 1 wherein the run length limited code comprises a 1,7 run length limited code in which there may be no fewer than one zero between flux transitions nor more than seven zeros between flux transitions.

5. The method set forth in claim 4 wherein the unique data sequence nominally comprises 10 000 000 100 000 001 (7,7) and the method detects patterns comprising:
    010 000 001 000 000 010 (6,7);
    1 000 000 001 000 000 010 (8,7);
    100 000 010 000 000 010 (6,8);
    100 000 000 100 000 010 (8,6);
    100 000 001 000 000 100 (7,6); and,
    100 000 001 000 000 001 (7,8).

6. The method set forth in claim 1 wherein the data stream includes a predetermined pattern of postamble data following said unique pattern, the method comprising the further step of decoding said predetermined pattern of postamble data.

7. The method set forth in claim 6 comprising a plurality of unique patterns characterized by said postamble data, so that plural address mark types may be identified and detected.

8. A fault tolerant address mark decoder for a data sequencer of a disk drive including a rotating data storage disk, a data transducer for reading blocks of data stored in concentric data tracks formed on a storage surface of said disk, the data being coded in accordance with a predetermined run length limited code, the decoder for detecting a unique data sequence forming an address mark within a stream of the run length limited coded data wherein the unique sequence is preceded by a predetermined preamble pattern, the unique data sequence comprising at least first and second adjacent sequences of zeros of a maximum permitted length under the run length limited code separated by first, second and third flux transitions, the decoder for starting a byte clock for controlling operations of said sequencer and comprising a state machine defining:

a first state for detecting the predetermined preamble pattern and for detecting said first flux transition,
    a second state following the first state for detecting a predetermined plurality of consecutive zeros following detection of said first flux transition,
    a third state following said second state for accumulating the balance of zeros of said first sequence until said second flux transition is detected, and for determining if the number of zeros of said first sequence is of a maximum permitted length, plus or minus one bit shift, and if so,
    a plurality of subsequent states following said third state for accumulating the second sequence of zeros until the third flux transition is reached and for determining if the sum of the first and second adjacent sequences equals the maximum permitted length, plus or minus one bit shift, and if so, a particular one of said plurality of subsequent states being determined by whether the first sequence equals the maximum permitted length, or equals one less than the maximum permitted length, or equals one greater than the maximum permitted length, and
    an idle state following each one of the plurality of subsequent states for signalling detection of said unique data sequence and for starting said byte clock at a proper time irrespective of said bit shift.

9. The decoder set forth in claim 8 further comprising a plurality of delay states between the plurality of subsequent states and the idle state for aligning the time of entering the idle state with respect to any bit shift detected.

10. The decoder set forth in claim 8 wherein the run length limited code comprises a 1,7 run length limited code in which there may be no fewer than one zero between flux transitions nor more than seven zeros between flux transitions.

11. The decoder set forth in claim 9 wherein the preamble pattern comprises 101 and the unique data pattern nominally comprises 10 000 000 100 000 001 (7,7) and wherein the decoder also detects patterns comprising:
    010 000 001 000 000 010 (6,7);
    1 000 000 001 000 000 010 (8,7);
    100 000 010 000 000 010 (6,8);
    100 000 000 100 000 010 (8,6);
    100 000 001 000 000 100 (7,6); and,
    100 000 001 000 000 001 (7,8).

12. The decoder set forth in claim 11 wherein the 6,7 pattern is detected by said third state and a fourth one of said plural subsequent states and said plurality of delay states includes a first delay state leading directly to said idle state and a second delay state upstream of said first delay state; wherein the 8,7 pattern is detected by said third state and a fifth one of said plural subsequent states, and further comprises said first delay state; wherein said 6,8 pattern is detected by said third state and said fourth one of said plural states and further comprises said first delay state; wherein said 8,6 pattern is detected by said third state and a sixth one of said plural states and further comprises said first delay state; wherein said 7,7 pattern is detected by said third state and a seventh one of said plural subsequent states and said first delay state, wherein said 7,6 pattern is detected by said third and the seventh one of said plural subsequent states and said second delay state and said first delay state; and, wherein said 7,8 pattern is detected by said third state and said seventh one of said plural subsequent states without any of said delay states.

13. The decoder set forth in claim 8 comprising a return path from said third state to said first state in the event that the balance of zeros accumulated at said third state is other than the maximum permitted length, plus or minus one bit shift.

14. The decoder set forth in claim 8 comprising a plurality of return paths from said plurality of subsequent states if the sum of the first and second adjacent sequences does not equal the maximum permitted length, plus or minus one bit shift.

15. A decoder for decoding a permissible address mark pattern within a data stream played back from a magnetic storage disk drive wherein the permissible address mark pattern and data stream are encoded in a manner consistent with a predetermined run length limited data code, wherein the permissible address mark pattern does not result from encoding of any combination of data values recorded onto the storage disk, and wherein the permissible address mark pattern comprises a sequence of successive clock cells including three magnetic flux transitions separated by a first uninterrupted string and a second interrupted string of plural clock cells not including a flux transition, the decoder including pattern detection means for detecting the permissible pattern, and for detecting one of a plurality of shifted address mark patterns in which one only of the three flux transitions is offset by zero, plus one, or minus one clock cell position, and further comprising selectable delay means selectively for delaying an address-mark-found synchronization signal by a predetermined amount selected to compensate for clock cell delays associated with at least some of the address mark patterns.

16. The decoder set forth in claim 15 wherein the pattern detection means detects the permissible address mark pattern comprising:
10 000 000 100 000 001 (7,7) wherein "1" denotes a flux transition within a clock cell, and "0" denotes the absence of a flux transition within a clock cell, and additionally detects the shifted address mark patterns comprising:
010 000 001 000 000 010 (6,7);
1 000 000 001 000 000 010 (8,7);
100 000 010 000 000 010 (6,8);
100 000 000 100 000 010 (8,6);
100 000 001 000 000 100 (7,6); and,
100 000 001 000 000 001 (7,8),
and wherein the selectable delay means selectively adds no clock cell delays upon detection of the (7,8) pattern, adds two clock cells upon detection of the (7,6) pattern, and adds a single clock cell delay upon detection of any one of the other said address mark patterns.

17. The decoder set forth in claim 15 wherein the pattern detection means comprises a state machine.

18. The decoder set forth in claim 17 wherein the state machine defines a plurality of progressive state sequences wherein a said state sequence determines the presence of the permissible address mark pattern, and each one of a plurality of other state sequences determines a respective one of the plurality of shifted address mark patterns.

19. The decoder set forth in claim 18 wherein the state machine detects the permissible address mark pattern in the form of 10 000 000 100 000 001 (7,7) wherein "1" denotes a flux transition within a clock cell, and "0" denotes the absence of a flux transition within a clock cell, and additionally detects the shifted address mark patterns in the form of:
010 000 001 000 000 010 (6,7);
1 000 000 001 000 000 010 (8,7);
100 000 010 000 000 010 (6,8);
100 000 000 100 000 010 (8,6);
100 000 001 000 000 100 (7,6); and,
100 000 001 000 000 001 (7,8),
and wherein the selectable delay means selectively adds no clock cell delays upon detection of the (7,8) pattern, adds two clock cells upon detection of the (7,6) pattern, and adds a single clock cell delay upon detection of any one of the other said address mark patterns.

20. The decoder set forth in claim 19 wherein the permissible and shifted address mark patterns are immediately preceded in the data stream by a predetermined preamble pattern, and wherein the state machine defines:
a first state for detecting the predetermined preamble pattern and for detecting said first flux transition,
a second state following the first state for detecting a predetermined plurality of consecutive clock cells not including a flux transition following detection of said first flux transition,
a third state following said second state for accumulating the balance of consecutive clock cells not including a flux transition until said second flux transition is detected, and for determining if the number of consecutive clock cells not including a flux transition between said first flux transition and said second flux transition is equal to the first uninterrupted string within plus or minus one clock cell, and
three subsequent states following said third state, each being selected by the sequence of the first uninterrupted string for determining if the total number of consecutive clock cells of the first uninterrupted string and a second uninterrupted string defined between the second and the third flux transitions is consistent with one of the permissible and shifted address mark patterns,
wherein the delay means comprises a plurality of delay states following said three subsequent states, and
an idle state following said delay states for signalling detection of one of the permissible and shifted address mark patterns and for starting a byte clock at a proper time irrespective of a shift in said one pattern.

* * * * *